United States Patent
Wu et al.

(10) Patent No.: US 11,604,238 B2
(45) Date of Patent: Mar. 14, 2023

(54) METHODS, APPARATUSES AND DEVICES FOR MONITORING DATA AND MAGNETIC RESONANCE SYSTEMS

(71) Applicants: Shanghai Neusoft Medical Technology Co., Ltd., Shanghai (CN); Neusoft Medical Systems Co., Ltd., Liaoning (CN)

(72) Inventors: Zhigang Wu, Shanghai (CN); Jiaolong He, Shanghai (CN); Guofeng Zan, Shanghai (CN)

(73) Assignees: Shanghai Neusoft Medical Technology Co., Ltd., Shanghai (CN); Neusoft Medical Systems Co., Ltd., Liaoning (CN)

( * ) Notice: Subject to any disclaimer, the term of this patent is extended or adjusted under 35 U.S.C. 154(b) by 58 days.

(21) Appl. No.: 17/394,322

(22) Filed: Aug. 4, 2021

(65) Prior Publication Data

US 2022/0057462 A1 Feb. 24, 2022

(30) Foreign Application Priority Data

Aug. 19, 2020 (CN) .......................... 202010839354.0
Jun. 8, 2021 (CN) .......................... 202110637150.3

(51) Int. Cl.
*G01R 33/36* (2006.01)
*G01R 33/28* (2006.01)

(52) U.S. Cl.
CPC ....... *G01R 33/3607* (2013.01); *G01R 33/288* (2013.01)

(58) Field of Classification Search
None
See application file for complete search history.

(56) References Cited

U.S. PATENT DOCUMENTS 8,102,177 B2 1/2012 McKinnon
8,717,021 B2 5/2014 Bottomley et al.
(Continued)

FOREIGN PATENT DOCUMENTS

CN 1589410 A 3/2005
CN 101354411 A 1/2009
(Continued)

OTHER PUBLICATIONS

Neufeld et al., "Analysis of the local worst-case SAR exposure caused by an MRI multi-transmit body coil in anatomical models of the human body," Physics in Medicine and Biology, 2011, 56:4649-4659.
(Continued)

*Primary Examiner* — Rodney E Fuller
(74) *Attorney, Agent, or Firm* — Fish & Richardson P.C.

(57) ABSTRACT

Methods, devices, and systems for data monitoring are provided. In one aspect, a method of data monitoring, applicable to a magnetic resonance system, includes: obtaining radio frequency (RF) waveform information which is to be sent to an RF transmitting coil of the magnetic resonance system; extracting target waveform information within a current sliding window from the RF waveform information, with a current time point being located within the current sliding window; obtaining, based on the target waveform information, target magnetic flux densities corresponding to the current sliding window; and determining a current real-time specific absorption rate (SAR) based on the target magnetic flux densities.

15 Claims, 3 Drawing Sheets

(56) References Cited

U.S. PATENT DOCUMENTS

| | | | |
|---|---|---|---|
| 9,714,993 B2 | 7/2017 | Hamamura et al. | |
| 2007/0273375 A1 | 11/2007 | Diehl | |
| 2012/0271155 A1 | 10/2012 | Alto | |
| 2015/0219738 A1 | 8/2015 | Chen | |
| 2016/0231396 A1* | 8/2016 | Sunaga | G01R 33/288 |

FOREIGN PATENT DOCUMENTS

| | | | |
|---|---|---|---|
| CN | 103705237 A | 4/2014 | |
| CN | 103720472 A | 4/2014 | |
| CN | 105931290 A | 9/2016 | |
| CN | 105974208 A | 9/2016 | |
| CN | 110558984 A | 12/2019 | |
| CN | 113303781 A | 8/2021 | |
| CN | 114826292 A | 7/2022 | |
| TW | 200952257 A | 12/2009 | |
| WO | WO2010094497 A1 | 8/2010 | |

OTHER PUBLICATIONS

Homann et al., "Patient-specific SAR models and in vivo validation," ResearchGate, Jan. 2010, Article uploaded by Ingmar Grasslin on Jan. 11, 2015, 2 pages.

Graesslin et al., "Real-time Global and Local SAR Monitoring for Parallel Transmission Systems," Proceedings of the International Society for Magnetic Resonance in Medicine, 2009, 17:302.

Wang, et al., "SAR and Temperature: Simulations and Comparison to Regulatory Limits for MRI," Journal of Magnetic Resonance Imaging 26:437-441 (2007), 5pages.

Schaefer, "SAR Measurement," GE Healthcare, Milwaukee, WI 53201, 4 pages.

Graesslin, "SAR & RF Power Monitoring," Proc. Intl. Soc. Mag. Reson. Med. 23 (2015), 6 pages.

Ye et al., "Towards Real-time SAR Measurement with MR Thermometry," Proc. Intl. Soc. Mag. Reson. Med. 21 (2013), 1 page.

Office Action and Search Report in Chinese Appln. No. 202110637150.3, dated Mar. 16, 2022, 18 pages (with Machine Translation).

Chen et al., "The Study of Time-averaging Algorithm in EMF Test," Safety and Electromagnetic Compatibility, Dec. 2021, 2021(5):37-41 (with English abstract).

Lee et al., "Spatially Variant Apodization for Image Reconstruction from Partial Fourier Data," IEEE Transactions on Image Processing, Nov. 2000, 9(11):1914-1925.

* cited by examiner

METHODS, APPARATUSES AND DEVICES FOR MONITORING DATA AND MAGNETIC RESONANCE SYSTEMS

CROSS-REFERENCE TO RELATED APPLICATION

The present disclosure claims priority to Chinese Patent Application No. 202010839354.0 filed on Aug. 19, 2020, and Chinese Patent Application No. 202110637150.3 filed on Jun. 8, 2021, the entire contents of which are incorporated herein by reference in their entireties.

TECHNICAL FIELD

The present disclosure relates to the field of medical imaging technology, and in particular, to methods, apparatuses and devices for monitoring data and to magnetic resonance systems.

BACKGROUND

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

The MRI is one of the main imaging modalities in the field of modern medical image. As a kind of tomography, the MRI achieves high resolution for soft tissue without radiological damage to a body.

The basic working principle of MRI is based on a magnetic resonance phenomenon. Specifically, hydrogen protons in the body are excited by radio frequency (RF) excitation pulses, position encoding is performed under a gradient field, signals with position information are then received by a receiver coil, and finally image information is reconstructed through Fourier transform. During an MRI examination, a part of the energy of the RF pulses used is absorbed by and deposited in the tissue. The amount of the deposited energy may be described by an SAR (Specific Absorption Rate).

To help ensure patient's safety during the MRI examination, a temperature increment of the tissues due to the RF pulse energy absorbed in the body can be limited. Compared to determining the temperature increment of the body, the SAR is easier to be managed and controlled and thus is commonly used to measure RF radiation, so as to help ensure compliance with a deposition limitation of the RF energy as defined by an International Electrotechnical Commission (IEC) standard.

SUMMARY

The present disclosure provides methods and devices for monitoring data and provides magnetic resonance systems, e.g., so as to reduce the cost of real time monitoring of SAR.

According to a first aspect of examples of the present disclosure, there is provided a method of monitoring data, which is applicable to a magnetic resonance system and includes: obtaining RF waveform information which is to be sent to an RF transmitting coil of the magnetic resonance system; extracting target waveform information within a current sliding window from the RF waveform information, with a current time point being located within the current sliding window; obtaining, based on the target waveform information, target magnetic flux densities corresponding to the current sliding window; and determining a current real-time SAR based on the target magnetic flux densities.

According to a second aspect of the examples of the present disclosure, there is provided a device for monitoring data, which is applicable to a magnetic resonance system and includes: a memory that is configured to store machine-readable instructions; and one or more processors. The one or more processors are configured to read the machine-readable instructions on the memory and perform the following operations: obtaining RF waveform information which is to be sent to an RF transmitting coil of the magnetic resonance system; extracting target waveform information within a current sliding window from the RF waveform information, with a current time point being located within the current sliding window; obtaining, based on the target waveform information, target magnetic flux densities corresponding to the current sliding window; and determining a current real-time SAR based on the target magnetic flux densities.

According to a third aspect of the examples of the present disclosure, there is provided a magnetic resonance system. The magnetic resonance system includes a master computer; a spectrometer control sub-system; a magnetic resonance device; an examination bed; and a device for monitoring data. The device for monitoring data is configured to perform: obtaining RF waveform information which is to be sent to an RF transmitting coil of the magnetic resonance device; extracting target waveform information within a current sliding window from the RF waveform information, with a current time point being located within the current sliding window; obtaining, based on the target waveform information, target magnetic flux densities corresponding to the current sliding window; and determining a current real-time SAR based on the target magnetic flux densities.

The technical solutions provided by the examples of the present disclosure may obtain the following beneficial effects.

In some examples, by obtaining RF waveform information before the RF waveform information is sent to an RF transmitting coil of a magnetic resonance system, extracting target waveform information within a current sliding window from the RF waveform information with a current time point being located within the current sliding window, obtaining target magnetic flux densities corresponding to the current sliding window based on the target waveform information, and determining a current real-time SAR based on the target magnetic flux densities, the approaches described here can achieve real time monitoring of the SAR by software without additional hardware added into the magnetic resonance system, which reduces the cost of monitoring the SAR.

It should be understood that the above general description and the following detailed description are only examples and explanatory, and are not intended to limit the present disclosure.

BRIEF DESCRIPTION OF THE DRAWINGS

The accompanying drawings, which are incorporated in and constitute a part of the description, illustrate examples consistent with the present disclosure and, together with the description, serve to explain the principles of the present disclosure.

DETAILED DESCRIPTION OF THE EMBODIMENTS

In related arts, an actual SAR is obtained by adding additional hardware into a magnetic resonance system to monitor RF incidence power and RF reflection power and calculating based on an established model. For this approach, additional hardware is added, which can be costly.

The examples of the present disclosure can achieve real time monitoring of the SAR by software without additional hardware added into the magnetic resonance system, which reduces the cost of real time monitoring of the SAR.

The methods of monitoring data provided by the present disclosure are described in detail below by means of examples.

Figure 1:
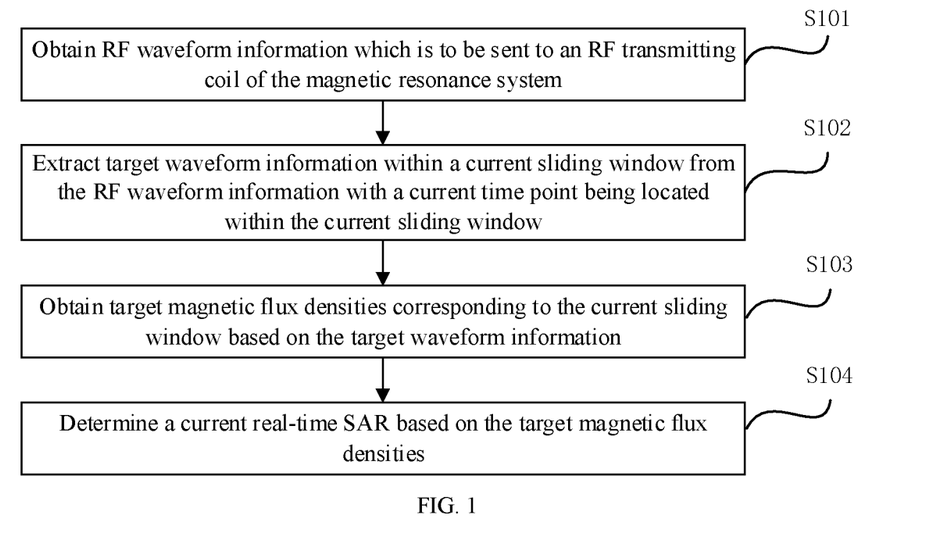
FIG. 1 is a flow chart illustrating a method of monitoring data according to an example of the present disclosure.

FIG. 1 is a flow chart illustrating a method of monitoring data according to an example of the present disclosure. As illustrated in FIG. 1, the method of monitoring data in the example is applicable to a magnetic resonance system and may include the following steps.

At S101, RF waveform information, which is to be sent to an RF transmitting coil of the magnetic resonance system, is obtained. In other words, the RF waveform information is obtained before being sent to the RF transmitting coil.

At S102, target waveform information within a current sliding window is extracted from the RF waveform information, with a current time point being located within the current sliding window.

At S103, target magnetic flux densities corresponding to the current sliding window are obtained based on the target waveform information.

At S104, a current real-time SAR is determined based on the target magnetic flux densities.

In general, the magnetic resonance system includes: a master computer (also called a scanning computer), a spectrometer control sub-system, a magnetic resonance device, and an examination bed. The magnetic resonance device may include an RF amplifier (e.g., an RF power amplifier), a gradient amplifier (e.g., a gradient power amplifier), an RF transmitting coil, an RF receiving coil, a gradient coil, a magnet, etc. The RF transmitting coil and the RF receiving coil may be realized in one coil.

In one operating mode, the master computer is configured to send a scanning protocol to the spectrometer control sub-system. The scanning protocol includes description information about an RF waveform. The spectrometer control sub-system is configured to generate the RF waveform information based on the description information about the RF waveform and send the RF waveform information to the RF amplifier of the magnetic resonance device. The RF amplifier controls the transmission of the RF transmitting coil based on the RF waveform information.

In this operating mode, during an example implementation, obtaining the RF waveform information may include obtaining the RF waveform information from the spectrometer control sub-system of the magnetic resonance system before the spectrometer control sub-system sends the RF waveform information to the RF transmitting coil.

Due to some external factors in some cases, the RF waveform information generated by the spectrometer control sub-system based on the description information about the RF waveform may differ from the RF waveform described by the description information. In the example, through obtaining the RF waveform information from the spectrometer control sub-system, accurate RF waveform information can be obtained, so that accurate target magnetic flux densities can be obtained based on the RF waveform information, and thus accurate real-time SAR can be obtained, which improves the accuracy of the real-time SAR.

In another operating mode, based on the description information about the RF waveform which is included in the scanning protocol, the master computer may generate the RF waveform information directly and send the RF waveform information to the spectrometer control sub-system. The spectrometer control sub-system in turn sends the RF waveform information to the RF amplifier of the magnetic resonance device, so that the RF amplifier can control the transmitting power of the RF transmitting coil based on the RF waveform information.

In this operating mode, during an example implementation, obtaining the RF waveform information may include obtaining the RF waveform information from the master computer of the magnetic resonance system before the master computer sends the RF waveform information to the spectrometer control sub-system.

In the example, the RF waveform information is obtained directly from the master computer, which can reduce the burden of the spectrometer control sub-system.

Figure 2:
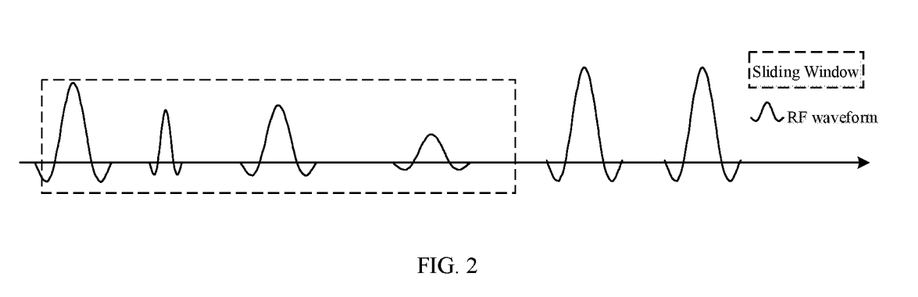
FIG. 2 is a schematic diagram of RF waveform information and a sliding window.

FIG. 2 is a schematic diagram of RF waveform information and a sliding window. Referring to FIG. 2, the horizontal axis indicates time, the longitudinal amplitude of an RF waveform indicates the magnetic flux density of an RF signal, and the dashed box indicates the sliding window.

A window width of the sliding window is preset. The window width of the sliding window is generally set based on a repetition time (TR). The TR generally refers to a time interval between a beginning of an RF pulse and a beginning of a next RF pulse.

The sliding window is constantly sliding with time, and the current time point is kept in the current sliding window. The current time point means a time point which occurs currently and in real time. The current time point may be located at any position within the current sliding window.

For example, the current time point may be located at a middle position within the current sliding window, at a starting position or an ending position within the current sliding window, or at another position other than the middle position, the starting position and the ending position within the current sliding window.

As an example, suppose that the sliding window has a window width of 4 seconds. On the axis of time, when the sliding window corresponds to a time period between the 3rd second and the 7th second, the current time point may be at the 5th second (which means that the current time point is now located at the middle position within the current sliding window), at the 3rd second (which means that the current time point is now located at the starting position within the current sliding window), at the 7th second (which means that the current time point is now located at the ending position within the current sliding window), or at the 4th second or at the 6th second (which means that the current time point is now located at another position other than the middle position, the starting position, and the ending position). Alternatively or additionally, the current time point may be located at the ending position within the current sliding window.

In the example, the target waveform information refers to information on the RF waveforms located within the current sliding window.

In the example, for the target waveform information, the amplitude of any point on the waveforms indicates the target magnetic flux density corresponding to this point, and the magnetic flux density corresponding to any point that is not on the waveforms is 0.

In an example implementation, determining the current real-time SAR based on the target magnetic flux densities in the step S104 may include constructing the current sliding window. For example, the window width of the current sliding window is constructed based on the repetition time of the RF waveform information; an integral sum of the target magnetic flux densities within the current sliding window is obtained; a conversion factor of the RF transmitting coil is obtained; a current real-time magnetic flux density is determined based on the integral sum and the window width of the current sliding window; and the current real-time SAR is obtained based on the real-time magnetic flux density and the conversion factor.

Supposing that the real-time magnetic flux density of the RF is $B_{1rms,real-time}$ and the target magnetic flux density is $B_1(t)$, the real-time magnetic flux density may be calculated by the following formula (1):

$$B_{1rms,real-time} = \sqrt{\frac{\int_0^{TR} B_1^2(t)dt}{TR}} \quad (1)$$

Further, the current real-time SAR, $SAR_{real-time}$, may be calculated by the following formula (2):

$$SAR_{real-time} \propto f_{coil} \cdot (B_{1rms,real-time})^2 \quad (2)$$

In the formula (2), $f_{coil}$ indicates the conversion factor. The value of the conversion factor may be measured and obtained via simulation or experiment.

In an example implementation, after the current real-time SAR is determined based on the target magnetic flux densities, whether the current real-time SAR exceeds a preset SAR threshold is determined; and if the current real-time SAR exceeds the SAR threshold, a scan-stopping command is sent to the magnetic resonance device, where the scan-stopping command instructs the magnetic resonance device to stop scanning.

According to the example, the scanning can be stopped in time once the current real-time SAR exceeds the SAR threshold to provide for the safety of the scanned object. The value of the SAR threshold may be determined as appropriate.

According to the methods of monitoring data provided by the examples of the present disclosure, by obtaining RF waveform information before the RF waveform information is sent to an RF transmitting coil of a magnetic resonance system, extracting target waveform information within a current sliding window from the RF waveform information with a current time point being located within the current sliding window, obtaining target magnetic flux densities corresponding to the current sliding window based on the target waveform information, and determining a current real-time SAR based on the target magnetic flux densities, real time monitoring of the SAR can be achieved by software without additional hardware added into the magnetic resonance system, which reduces the cost of monitoring the SAR.

Moreover, in the related arts, false alarms often happen when the hardware is relied upon to perform the monitoring. The methods of monitoring data provided by the examples of the present disclosure avoid false alarms and improve the robustness of monitoring the SAR.

Based on the method examples described above, corresponding apparatus examples, device examples, magnetic resonance system examples, and storage medium examples are also provided by the present disclosure.

Figure 3:
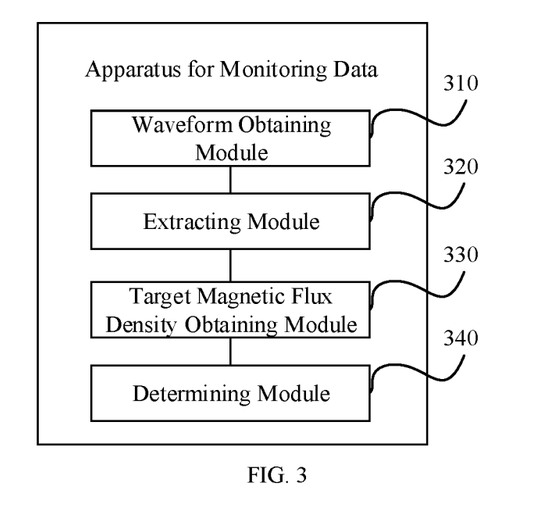
FIG. 3 is a functional block diagram of an apparatus for monitoring data according to an example of the present disclosure.

FIG. 3 is a functional block diagram of an apparatus for monitoring data according to an example of the present disclosure. As illustrated in FIG. 3, the apparatus for monitoring data in the example is applicable to a magnetic resonance system and may include:

a waveform obtaining module 310 that is configured to obtain RF waveform information which is to be sent to an RF transmitting coil of the magnetic resonance system;

an extracting module 320 that is configured to extract target waveform information within a current sliding window from the RF waveform information, with a current time point being located within the current sliding window, for example, located at an ending position of the current sliding window;

a target magnetic flux density obtaining module 330 that is configured to obtain, based on the target waveform information, target magnetic flux densities corresponding to the current sliding window; and a determining module 340 that is configured to determine a current real-time SAR based on the target magnetic flux densities.

In an example implementation, the waveform obtaining module 310 may be specifically configured to obtain the RF waveform information from a master computer of the magnetic resonance system.

In an example implementation, the waveform obtaining module 310 may be specifically configured to obtain the RF waveform information from a spectrometer control subsystem of the magnetic resonance system.

In an example implementation, the apparatus for monitoring data may further include: a deciding module that is configured to determine whether the current real-time SAR exceeds a preset SAR threshold; and a controlling module that is configure to send a scan-stopping command to a magnetic resonance device of the magnetic resonance system if the current real-time SAR exceeds the SAR threshold, where the scan-stopping command instructs the magnetic resonance device to stop scanning.

In an example implementation, the determining module 340 may be specifically configured to: construct the current sliding window, for example, construct a window width of the current sliding window based on a repetition time of the RF waveform information; obtain an integral sum of the target magnetic flux densities corresponding to the current sliding window; obtain a conversion factor of the RF transmitting coil; determine a current real-time magnetic flux density based on the integral sum and the window width of the current sliding window; and obtain the current real-time SAR based on the real-time magnetic flux density and the conversion factor.

Figure 4:
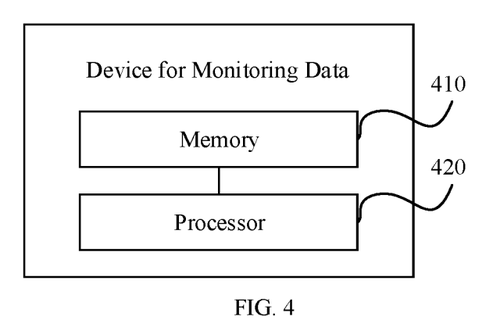
FIG. 4 is a structure block diagram of a device for monitoring data according to an example of the present disclosure.

An example of the present disclosure also provides a device for monitoring data. As illustrated in FIG. 4, the device for monitoring data is applicable to a magnetic resonance system and includes: a memory 410 that is configured to store machine-readable instructions; and one or more processors 420 that are configured to read the machine-readable instructions on the memory and perform the following operations:

obtaining RF waveform information which is to be sent to an RF transmitting coil of the magnetic resonance system; extracting target waveform information within a current sliding window from the RF waveform information, with a current time point being located within the current sliding window; obtaining, based on the target waveform information, target magnetic flux densities corresponding to the current sliding window; and determining a current real-time SAR based on the target magnetic flux densities.

In an example implementation, the one or more processors 420, when obtaining the RF waveform information, are configured to obtain the RF waveform information from a master computer of the magnetic resonance system.

In an example implementation, the one or more processors 420, when obtaining the RF waveform information, are configured to obtain the RF waveform information from a spectrometer control sub-system of the magnetic resonance system.

In an example implementation, the one or more processors 420 are further configured to determine whether the current real-time SAR exceeds a preset SAR threshold; and if the current real-time SAR exceeds the SAR threshold, send a scan-stopping command to a magnetic resonance device of the magnetic resonance system, where the scan-stopping command instructs the magnetic resonance device to stop scanning.

In an example implementation, the one or more processors 420, when determining the current real-time SAR based on the target magnetic flux densities, are configured to construct the current sliding window, for example, constructing a window width of the current sliding window based on a repetition time of the RF waveform information; obtain an integral sum of the target magnetic flux densities corresponding to the current sliding window; obtain a conversion factor of the RF transmitting coil; determine a current real-time magnetic flux density based on the integral sum and the window width of the current sliding window; and obtain the current real-time SAR based on the real-time magnetic flux density and the conversion factor.

Figure 5:
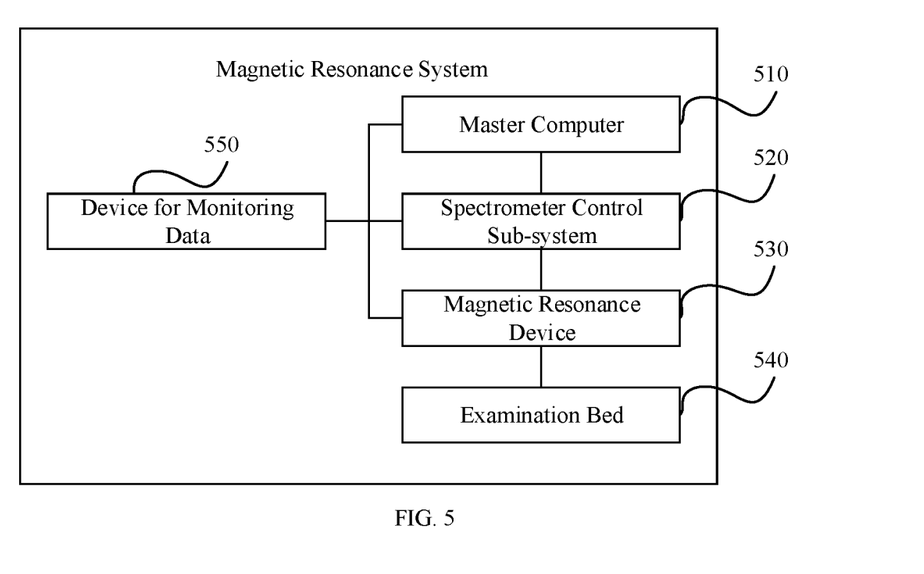
FIG. 5 is a structure block diagram of a magnetic resonance system according to an example of the present disclosure.

An example of the present disclosure also provides a magnetic resonance system. As illustrated in FIG. 5, the magnetic resonance system includes a master computer 510, a spectrometer control sub-system 520, a magnetic resonance device 530, an examination bed 540, and a device for monitoring data 550. The device for monitoring data 550 is configured to obtain RF waveform information which is to be sent to an RF transmitting coil of the magnetic resonance device 530; extract target waveform information within a current sliding window from the RF waveform information, with a current time point being located within the current sliding window, for example, located at an ending position of the current sliding window; obtain, based on the target waveform information, target magnetic flux densities corresponding to the current sliding window; and determine a current real-time SAR based on the target magnetic flux densities.

In an example implementation, obtaining the RF waveform information may include: obtaining the RF waveform information from the master computer 510 of the magnetic resonance system before the master computer 510 sends the RF waveform information to the spectrometer control sub-system 520.

In an example implementation, the obtaining the RF waveform information may include: obtaining the RF waveform information from the spectrometer control sub-system 520 of the magnetic resonance system before the spectrometer control sub-system 520 sends the RF waveform information to the RF transmitting coil.

In an example implementation, the following operations may be further included: determining whether the current real-time SAR exceeds a preset SAR threshold; and if the current real-time SAR exceeds the SAR threshold, sending a scan-stopping command to the magnetic resonance device 530 of the magnetic resonance system, where the scan-stopping command instructs the magnetic resonance device 530 to stop scanning.

In an example implementation, the determining the current real-time SAR based on the target magnetic flux densities may include: constructing the current sliding window, for example, constructing a window width of the current sliding window based on a repetition time of the RF waveform information; obtaining an integral sum of the target magnetic flux densities corresponding to the current sliding window; obtaining a conversion factor of the RF transmitting coil; determining a current real-time magnetic flux density based on the integral sum and the window width of the current sliding window; and obtaining the current real-time SAR based on the real-time magnetic flux density and the conversion factor.

An example of the present disclosure also provides a computer-readable storage medium storing a computer program thereon. The program, when executed by one or more processors, implements the following operations: obtaining RF waveform information which is to be sent to an RF transmitting coil of a magnetic resonance system; extracting target waveform information within a current sliding window from the RF waveform information, with a current time point being located within the current sliding window, for example, located at an ending position of the current sliding window; obtaining, based on the target waveform information, target magnetic flux densities corresponding to the current sliding window; and determining a current real-time SAR based on the target magnetic flux densities.

In an example implementation, obtaining the RF waveform information may include: obtaining the RF waveform information from a master computer of the magnetic resonance system before the master computer sends the RF waveform information to a spectrometer control sub-system.

In an example implementation, obtaining the RF waveform information may include: obtaining the RF waveform information from the spectrometer control sub-system of the magnetic resonance system before the spectrometer control sub-system sends the RF waveform information to the RF transmitting coil.

In an example implementation, the following operations may be further included: determining whether the current real-time SAR exceeds a preset SAR threshold; and if the current real-time SAR exceeds the SAR threshold, sending a scan-stopping command to a magnetic resonance device of the magnetic resonance system, where the scan-stopping command instructs the magnetic resonance device to stop scanning.

In an example implementation, determining the current real-time SAR based on the target magnetic flux densities may include: constructing the current sliding window, for example, constructing a window width of the current sliding window based on a repetition time of the RF waveform information; obtaining an integral sum of the target magnetic flux densities corresponding to the current sliding window; obtaining a conversion factor of the RF transmitting coil; determining a current real-time magnetic flux density based on the integral sum and the window width of the current sliding window; and obtaining the current real-time SAR based on the real-time magnetic flux density and the conversion factor.

Since the apparatus examples and the device examples generally correspond to the method examples, reference may be made to the description of related parts of the method examples. The apparatus examples described above are merely illustrative, where the modules described as separate components may or may not be physically separated, and the components displayed as modules may or may not be physical units, that is, may be located in one place or distributed to multiple units in a network. Some or all of the modules may be selected according to actual needs to achieve the objectives of the present disclosure. It can be understood and implemented by those of ordinary skill in the art without any creative effort.

Specific examples of the present disclosure are described above. Other examples are within the scope of the appended claims. In some cases, the actions or steps documented in the claims may be performed in a different order than in the examples and still achieve the desired results. In addition, the processes described in the accompanying drawings do not necessarily require the particular order or sequential order illustrated to achieve the desired results. In some implementations, multi-task processing and parallel processing may also be possible or may be advantageous.

Other implementations of the present disclosure will be readily apparent to those skilled in the art after implementing the disclosure by referring to the description. The present disclosure is intended to cover any variations, uses, or adaptations of the description that follow the general principles thereof and include common knowledge or conventional technical means in the related art that are not disclosed in the description. The description and the examples are only illustrative, and the true scope and spirit of the present disclosure are set forth in the appended claims.

It is to be understood that the present disclosure is not limited to the above described accurate structures illustrated in the drawings, and various changes and modifications can be made to the present disclosure without departing from the scope thereof. The scope of the present disclosure is to be limited only by the appended claims.

Only the better examples of the present disclosure are presented above, and are not intended to limit the present disclosure. In the spirit and principles of the present disclosure, any modification, equivalent replacement, improvement, etc., shall be included in the scope of protection of the present disclosure.

The invention claimed is:

1. A method of data monitoring, applicable to a magnetic resonance system, the method comprising:
   obtaining radio frequency (RF) waveform information which is to be sent to an RF transmitting coil of the magnetic resonance system;
   extracting target waveform information within a current sliding window from the RF waveform information, with a current time point being located within the current sliding window;
   obtaining, based on the target waveform information, target magnetic flux densities corresponding to the current sliding window; and
   determining a current real-time specific absorption rate (SAR) based on the target magnetic flux densities.

2. The method according to claim 1, wherein obtaining the RF waveform information comprises:
   obtaining the RF waveform information from a master computer of the magnetic resonance system.

3. The method according to claim 1, wherein obtaining the RF waveform information comprises:
   obtaining the RF waveform information from a spectrometer control sub-system of the magnetic resonance system.

4. The method according to claim 1, further comprising:
   determining whether the current real-time SAR exceeds a preset SAR threshold; and
   in response to determining that the current real-time SAR exceeds the SAR threshold, sending a scan-stopping command to a magnetic resonance device of the magnetic resonance system, wherein the scan-stopping command instructs the magnetic resonance device to stop scanning.

5. The method according to claim 1, wherein determining the current real-time SAR based on the target magnetic flux densities comprises:
   constructing the current sliding window;
   obtaining an integral sum of the target magnetic flux densities corresponding to the current sliding window;
   obtaining a conversion factor of the RF transmitting coil;
   determining a current real-time magnetic flux density based on the integral sum and a window width of the current sliding window; and
   obtaining the current real-time SAR based on the real-time magnetic flux density and the conversion factor.

6. The method according to claim 5, wherein constructing the current sliding window comprises:
   constructing the window width of the current sliding window based on a repetition time of the RF waveform information.

7. The method according to claim 1, wherein the current time point being located within the current sliding window comprises:
   the current time point being located at an ending position of the current sliding window.

8. A device for monitoring data, applicable to a magnetic resonance system, the device comprising:
   one or more processors; and
   one or more memories coupled to the one or more processors and storing machine-readable instructions for execution by the one or more processors to perform operations comprising:
      obtaining radio frequency (RF) waveform information which is to be sent to an RF transmitting coil of the magnetic resonance system;
      extracting target waveform information within a current sliding window from the RF waveform information, with a current time point being located within the current sliding window;
      obtaining, based on the target waveform information, target magnetic flux densities corresponding to the current sliding window; and determining a current real-time specific absorption rate (SAR) based on the target magnetic flux densities.

9. The device according to claim 8, wherein obtaining the RF waveform information comprises:
   obtaining the RF waveform information from a master computer of the magnetic resonance system.

10. The device according to claim 8, wherein obtaining the RF waveform information comprises:
    obtaining the RF waveform information from a spectrometer control sub-system of the magnetic resonance system.

11. The device according to claim 8, wherein the operations further comprise:
    determining whether the current real-time SAR exceeds a preset SAR threshold; and
    in response to determining that the current real-time SAR exceeds the SAR threshold, sending a scan-stopping command to a magnetic resonance device of the magnetic resonance system, wherein the scan-stopping command instructs the magnetic resonance device to stop scanning.

12. The device according to claim 8, wherein determining the current real-time SAR based on the target magnetic flux densities comprises:
    constructing the current sliding window;
    obtaining an integral sum of the target magnetic flux densities corresponding to the current sliding window;
    obtaining a conversion factor of the RF transmitting coil;
    determining a current real-time magnetic flux density based on the integral sum and a window width of the current sliding window; and
    obtaining the current real-time SAR based on the real-time magnetic flux density and the conversion factor.

13. The device according to claim 12, wherein constructing the current sliding window comprises:
    constructing the window width of the current sliding window based on a repetition time of the RF waveform information.

14. The device according to claim 8, wherein the current time point being located within the current sliding window comprises:
    the current time point being located at an ending position of the current sliding window.

15. A magnetic resonance system, comprising:
    a master computer;
    a spectrometer control sub-system;
    a magnetic resonance device;
    an examination bed; and
    a device for monitoring data, the device being configured to:
    obtain radio frequency (RF) waveform information which is to be sent to an RF transmitting coil of the magnetic resonance device;
    extract target waveform information within a current sliding window from the RF waveform information, with a current time point being located within the current sliding window;
    obtain, based on the target waveform information, target magnetic flux densities corresponding to the current sliding window; and
    determine a current real-time specific absorption rate (SAR) based on the target magnetic flux densities.

* * * * *